(12) United States Patent
Nirschl et al.

(10) Patent No.: US 8,670,277 B2
(45) Date of Patent: Mar. 11, 2014

(54) MEMORY AND METHOD FOR PROGRAMMING MEMORY CELLS

(75) Inventors: Thomas Nirschl, Putzbrunn (DE); Jan Otterstedt, Unterhaching (DE); Wolf Allers, München (DE); Dominique Savignac, Ismaning (DE)

(73) Assignee: Infineon Technologies AG, Neubiberg (DE)

( * ) Notice: Subject to any disclaimer, the term of this patent is extended or adjusted under 35 U.S.C. 154(b) by 196 days.

(21) Appl. No.: 13/192,227

(22) Filed: Jul. 27, 2011

(65) Prior Publication Data

US 2013/0028026 A1    Jan. 31, 2013

(51) Int. Cl.
*G11C 16/04*    (2006.01)

(52) U.S. Cl.
USPC ............ 365/185.19; 365/185.18; 365/189.09; 365/230.06

(58) Field of Classification Search
USPC ............. 365/185.19, 185.18, 189.01, 185.17, 365/185.23, 185.13, 233.1, 189.09, 189.11, 365/230.06
See application file for complete search history.

(56) References Cited

U.S. PATENT DOCUMENTS

| 5,691,939 | A | 11/1997 | Chang et al. |
| 6,044,015 | A | 3/2000 | Van Houdt et al. |
| 6,111,788 | A | 8/2000 | Chen et al. |
| 7,611,941 | B1 | 11/2009 | Shum et al. |
| 2005/0099849 | A1 | 5/2005 | Lutze et al. |
| 2006/0274580 | A1* | 12/2006 | Forbes ................... 365/185.18 |
| 2007/0008781 | A1* | 1/2007 | Jono et al. ................ 365/185.23 |
| 2007/0136529 | A1* | 6/2007 | Otterstedt et al. ............ 711/115 |

* cited by examiner

*Primary Examiner* — Tuan T. Nguyen
(74) *Attorney, Agent, or Firm* — Murphy, Bilak & Homiller, PLLC

(57) ABSTRACT

A memory includes a memory cell including a first terminal, a second terminal and a channel extending between the first terminal and the second terminal. The memory further includes an energy storage element configured to support a programming of the memory cell, the energy storage element being coupled to the first terminal, an energy supply coupled to the energy storage element, and a controller. The controller is configured to activate the energy supply and to bring the channel of the memory cell into a non-conductive state for energizing the energy storage element, and to subsequently bring the channel of the memory cell into a conductive state for programming the memory cell based on the energy stored in the energy storage element.

27 Claims, 10 Drawing Sheets

MEMORY AND METHOD FOR PROGRAMMING MEMORY CELLS

TECHNICAL FIELD

The present application relates to a memory and methods for programming memory cells.

BACKGROUND

When NVM (non volatile memory) cells are programmed using hot carrier injection, relatively high currents are required from a voltage that is higher than the core voltage. This programming current is typically provided by a charge pump that generates a higher voltage from the core voltage of the system.

Due to a limited current driving capability of the charge pump, a limited number of NVM cells (e.g. 8 memory cells selected in parallel) can be written to in parallel. Programming more cells requires a sequential write operation, which requires a relatively long time to execute.

To achieve a higher parallel throughput, the charge pump and its associated paths into the memory array would have to be designed for higher currents, which increases chip area and chip current consumption.

SUMMARY

Embodiments described herein provide a memory. The memory comprises a memory cell comprising a first terminal, a second terminal and a channel extending between the first terminal and the second terminal. Furthermore, the memory comprises an energy storage element configured to support a programming of the memory cell, the energy storage element being coupled to the first terminal. Furthermore, the memory comprises an energy supply coupled to the energy storage element and a controller. The controller is configured to activate the energy supply and to bring the channel of the memory cell into a non-conductive state for energizing the energy storage element, and to subsequently bring the channel of the memory cell into a conductive state for programming the memory cell based on the energy stored in the energy storage element.

Further embodiments described herein provide a memory comprising a plurality of memory cells. Each memory cell comprises a first terminal, a second terminal and a channel extending between the first terminal and the second terminal. Furthermore, the memory comprises a plurality of programming support capacitances, a programming support capacitance of the plurality of programming support capacitances being coupled to a first terminal of a memory cell of the plurality of memory cells. Furthermore, the memory comprises a charge provider coupled to the plurality of programming support capacitances and a controller configured to activate the charge provider and to bring the channels of the plurality of memory cells into a non-conductive state for charging the programming support capacitances being coupled to the charge provider. The controller is further configured to subsequently bring the channels of the plurality of memory cells in a conductive state for programming the plurality of memory cells based on the charges stored in the plurality of programming support capacitances.

Those skilled in the art will recognize additional features and advantages upon reading the following detailed description, and upon viewing the accompanying drawings.

SHORT DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the present application the meaning of the term 'coupling' is in the sense of a direct low impedance coupling and an indirect coupling with one more elements in-between, such that a signal at a second node is dependent on a signal at a first node which is coupled to the second node. In other words, further elements, especially switching elements (like transistors) or drivers, may be placed between two coupled elements. Between two coupled elements an additional element may placed, but not necessarily need to, therefore two coupled elements may be directly connected (using a low impedance connection, like a wire or a trace or a conductor path).

Figure 1:
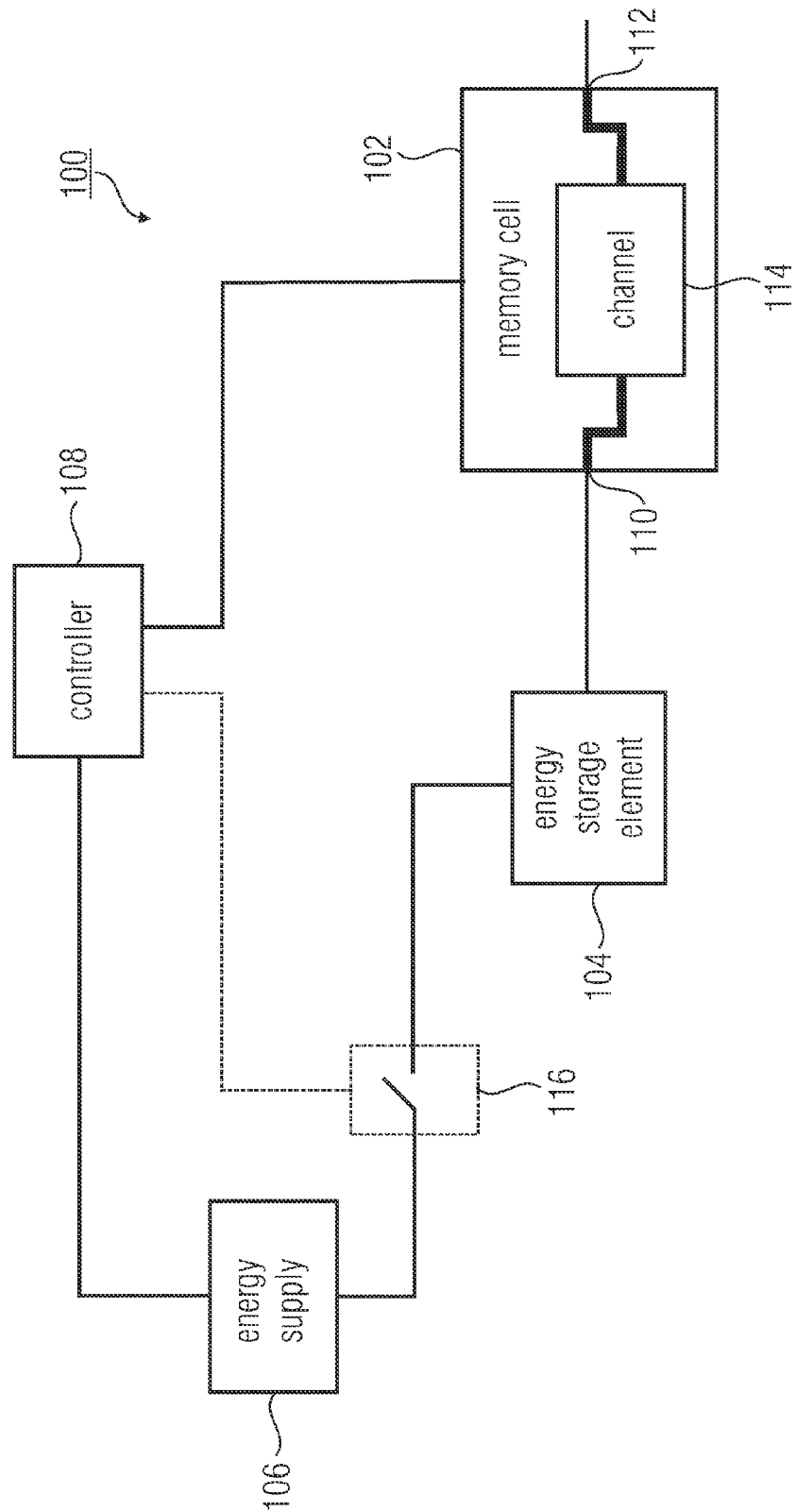
FIG. 1 shows a block schematic diagram of a memory according to an embodiment.

FIG. 1 shows a block schematic diagram of a memory 100 according to an embodiment. The memory 100 includes a memory cell 102, an energy storage element 104, an energy supply 106 and a controller 108. The memory cell 102 has a first terminal 110, a second terminal 112 and a channel 114 extending between the first terminal 110 and the second terminal 112.

The energy storage element 104, which is used for supporting a programming of the memory cell 102, is (permanently) coupled to the first terminal 110 of the memory cell 102. The energy supply 106 is coupled to the energy storage element 104. As can be seen from FIG. 1, the energy supply 106 may be coupled to the energy storage element 104 by a switch 116. According to further embodiments the energy supply 106 may be permanently coupled to the energy storage element 104. The controller 108 is configured to activate the energy supply 106 and to bring the channel 114 of the memory cell 102 in a non-conductive state for energizing the energy storage element 104 (i.e. supplying the energy storage element 104 with energy), and to subsequently (after the energy storage element 104 is energized) bring the channel 114 of the memory cell 102 into a conductive state for programming the memory cell 102 based on the energy stored in the energy storage element 104 (so called shot programming).

As described in the introductory part of the application a problem of known memories is the limited current driving capability of a charge pump, such that only a limited number of memory cells can be written to in parallel. The memory 100 and further embodiments described herein solve this problem by energizing the energy storage element 104 in a non-conductive state of the channel 114 of the memory cell 102 and by, after the energy storage element 104 is energized, bringing the channel 114 of the memory cell 102 into a conductive state such that the necessary programming current for the memory cell 102 is (mainly) supplied from the energy stored in the energy storage element 104 and only partially (if at all) from the energy supply 106. By energizing the energy storage element 104 before the channel 114 is brought into the conductive state a high amount of energy can be brought into the energy storage element 104 sufficient to program the channel 114 of the memory cell 102.

This is especially advantageous in memories including a plurality of memory cells, in which for every memory cell an associated energy storage element is energized, before the channels of the memory cells are brought into the conductive state. The drive capability of the energy supply 106 is not the limiting factor anymore for the number of memory cells that can be programmed in parallel, since the necessary programming current is mainly (or completely) supplied from the energy stored in the energy storage elements of the memory cells.

Therefore, a high number of memory cells can be programmed in parallel, which enables a faster programming of a memory including a plurality of memory cells.

According to some embodiments, the memory 100 may be a one time programmable memory (such as a fuse) or a reprogrammable memory. Furthermore, the memory 100 may be a non-volatile memory, i.e. the memory cell 102 is a non-volatile memory cell.

According to some embodiments the memory 100 may include a bit line coupled to the first terminal 110. The bit line of the memory 100 may be used to address a certain memory cell (for example in conjunction with a word line) of the memory 100. Such a bit line is typically coupled to a plurality of memory cells (for example a plurality of memory cells 102) of the memory 100 and, therefore, has a significant length and, as each conductor has a certain parasitic capacitance, also has a certain capacitance, also called bit line capacitance. In embodiments described herein the energy storage element 104 can be at least partially (or completely) formed by this capacitance of the bit line. The energy supply 106 (for example formed as a charge pump) can be configured to charge the capacitance of the bit line during the non-conductive state of the channel 114, such that a certain amount of charge is brought onto the capacitance of the bit line, which subsequently (after the capacitance of the bit line has been charged) can be used during the conductive state of the channel 114 to program the memory cell 102. In other words, the necessary programming current for programming the memory cell 102 can be supplied mainly (or completely) from the charge capacitance of the bit line coupled to the first terminal 110 of the memory cell 102.

According to further embodiments, the controller 108 may be configured to bring the channel of the memory cell 102 in the conductive state after an energy at the energy storage element 104 has reached at least 80% of an energy storage capacity of the energy storage element 104. This energy storage capacity is dependent on the maximum energy that can be provided by the energy supply 106 and also of a size of the energy storage element 104 (for example dependent on an inductivity and/or a capacity of the energy storage element 104). In other words, the controller 108 may be configured to not bring the channel 114 in the conductive state before a substantial amount of energy is stored on the energy storage element 104, which is sufficient for programming the memory cell 102.

As mentioned before, the energy storage element 104 may be formed by a capacitance, for example, by the bit line capacitance of the bit line coupled to the first terminal 110 of the memory cell 102 and/or by an additional capacitance coupled to the first terminal 110. This capacitance may also be called a programming support capacitance. In this case the controller 108 may be configured to bring the channel 114 of the memory cell 102 into the conductive state after a voltage at the program support capacitance has reached at last 80% of a maximum voltage at the programming support capacitance. The maximum voltage may be defined by a maximum voltage generated by the energy supply 106. In other words, the controller 108 may be configured to keep the energy supply 106 activated (and coupled to the memory cell 102) and the channel 114 in the non-conductive state until a voltage at the program support capacitance reaches or succeeds a certain threshold voltage, corresponding to an amount of charge which is sufficient to program the memory cell 102.

According to some embodiments the controller 108 may be configured to deactivate the energy supply 106 after energizing the energy storage element 104, such that during the programming of the memory cell 102 the energy supply 106 is deactivated. Furthermore (additionally to deactivating the energy supply 106 or instead of deactivating the energy supply 106) the controller 108 may be configured to decouple the energy supply 106 (for example by placing the switch 116 into a high impedance state) from the energy storage element 104 after energizing the energy storage element 104, such that during the programming of the memory cell 102 the energy supply 106 is decoupled from the energy storage element 104. By deactivating and/or decoupling the energy supply 106 it can be achieved that during the programming of the memory cell 102 the necessary programming current along the channel 114 is supplied only based on the energy stored in the energy storage element 104. Hence, no additional current is supplied from the energy supply 106 during the programming of the memory cell 102 according to these embodiments.

Therefore, by decoupling and/or deactivating the energy supply 106 during the conductive state of the channel 114 a power consumption of the complete memory 100 during the programming can be reduced. Therefore, the current consumption during a programming can easily be made independent of the data to be programmed on the memory cell 102.

Furthermore, the energizing timing for the energy storage element 104 can be constant independent on the data to be programmed on the memory cell 102. This can be achieved when an energy storage element 104 of a first memory cell, which is not to be programmed in this programming cycle, is charged together with other energy storage elements 104 of other memory cells which have to be programmed in this programming cycle, and when the energy storage element 104 of the first memory cell is discharged before the channels 114 of the first memory cells and the other memory cells are brought into the conductive state. Such a constant timing and constant current are advantageous for security critical applications, since no information about the programmed data is leaked to the outside through timing or current.

According to further embodiments, for example in the case in which the energy storage element 104 is not capable of storing enough energy for completely programming the memory cell 102 (for example in the case of small memories with only short bit lines and therefore only small bit line capacitances), the controller 108 may be configured to keep the energy supply 106 active and coupled to the energy storage element 104 during the programming of the memory cell 102. In these cases the programming current for the memory cell 102 is supplied from the energy storage element 104 and from the energy supply 106 together.

According to further embodiments the memory 100 may be configured to store more than two different information states in the memory cell 102. In these embodiments, the controller 108 may be configured to vary an energizing parameter for energizing the energy storage element 104 with the energy supply 106 during the non-conductive state of the channel 114 in dependence on an information state to be stored on the memory cell 102. As an example, the controller 108 may be configured to vary an energizing time of the energy storing element 104 in dependence on an information state to be stored on the memory cell 102. The controller 108 may be configured to vary this energizing time by decoupling the energy supply 106 from the energy storage element 104 during the non-conductive state of the channel 114 by placing the switch 116 into a high impedance state.

This enables a different programming of a plurality of memory cells of the memory 100, as the plurality of memory cells of the memory 100 each can be coupled to the energy supply 106 by a plurality of switches 116 and the controller 108 may put different switches 116 into a high impedance state after different energizing times in dependence on the information state to be stored on the associated memory cell.

Hence, the energy supply 106 may remain activated although some energy storage elements 104 associated to a first group of memory cells onto which a first information state is to be programmed are already decoupled from the energy supply 106, but other energy storage elements 104 associated to a second group of memory cells onto which a second information state is to be programmed are still coupled to the energy supply 106.

According to further embodiments, the controller 108 may change a voltage or a current produced from the energy supply 106 as energizing parameter in dependence on the information state to be stored on the memory cell 102.

Figure 2:
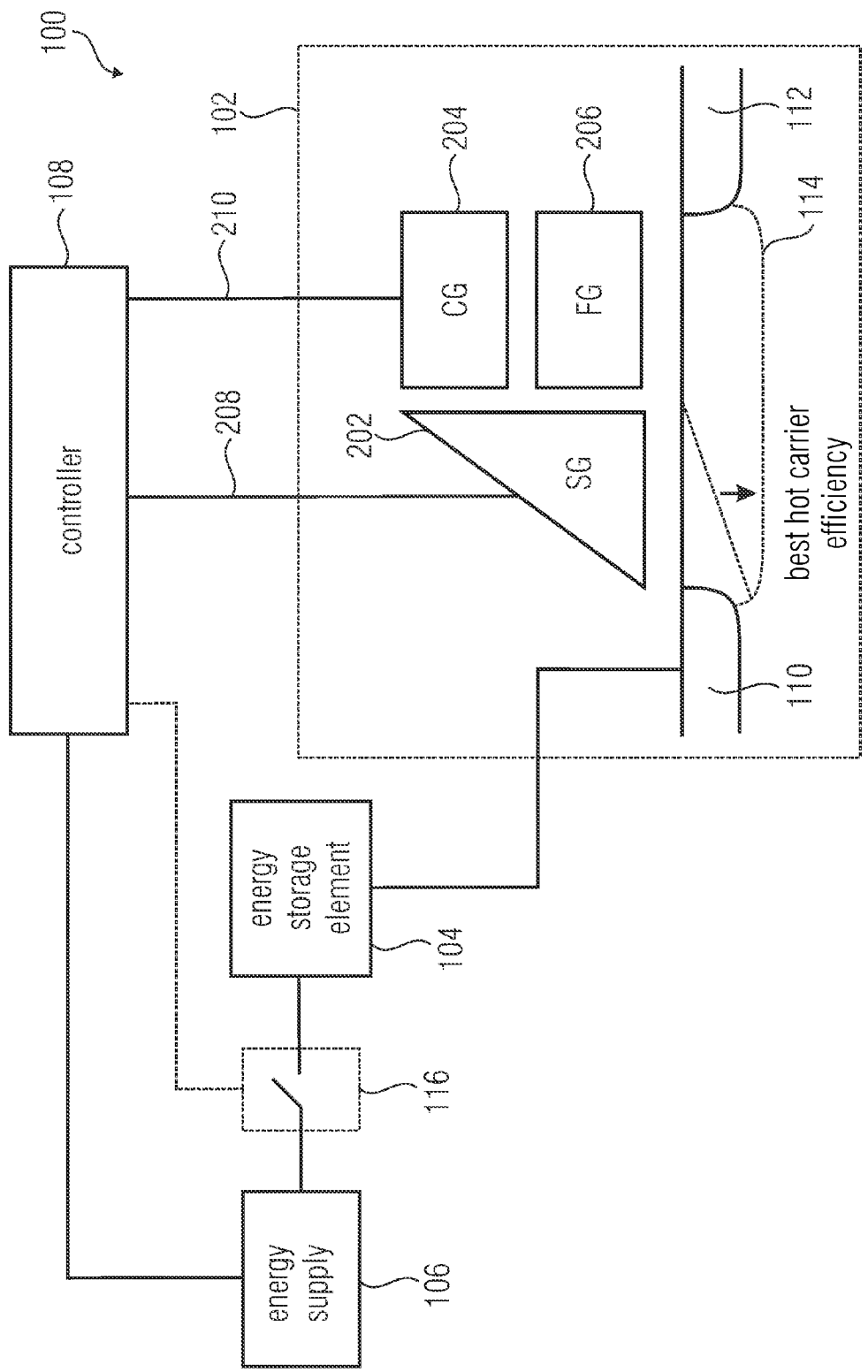
FIG. 2 shows a block schematic diagram of a memory according to a further embodiment.

FIG. 2 shows another block schematic diagram of the memory 100 with a possible implementation of the memory cell 102. In the embodiment shown in FIG. 2 the memory cell 102 includes a transistor structure with a source region, a drain region and a channel region. A first terminal 110 of the memory cell 102 is formed by the drain region, therefore the drain region is also given the reference number 110. The second terminal 112 of the memory cell 102 is formed by the source region, therefore the source region is also given the reference number 112. The channel 114 of the memory cell 102 is formed by the channel region, therefore the channel region is also given the reference number 114. As can be seen from FIG. 2, the energy storage element 104 (for example a bit line) can be coupled to the drain region 110. In a normal application the source region 112 can be coupled to a source line of the memory 100. Furthermore, the transistor structure of the memory cell 102 includes a select element 202, which is in the embodiment in FIG. 2 formed as a select gate 202. According to further embodiments the select element 202 may include or may be formed by a separate transistor structure, which may even be a bipolar transistor structure.

Furthermore, the transistor structure includes a control terminal, which is in the embodiment in FIG. 2 formed as a control gate 204. Furthermore, the transistor structure includes a floating gate 206. Hence, the memory cell 102 shown in FIG. 2 is a so-called triple poly cell.

Nevertheless, according to further embodiments, the memory cell 102 may also be another memory cell, for example an ETOX cell (ETOX-EPROM tunnel oxide) in which the select gate 202 may be omitted.

The drain region 110 and the source region 112 may be highly doped regions from a first doping type (for example n doping or p doping). The channel region 114 may be a lowly doped region from a second doping type (for example p doping or n doping). Therefore, the transistor structure may be an n channel transistor or a p channel transistor. According to further embodiments the transistor structure may also be a bipolar transistor.

The select gate 202 is arranged adjacent the channel region 114 and isolated from the channel region 114. Furthermore, the floating gate 206 is arranged adjacent the channel region 114 and neighboring the select gate 202. Furthermore, the floating gate 206 is isolated from the select gate 202 and the channel region 114. The control gate 204 is arranged adjacent the floating gate 206 and neighboring the select gate 202. In a layer staple direction of the memory cell 102, the floating gate 206 and the select gate 202 follow the channel region 114 and the control gate 204 follows the floating gate 206.

The control gate 204 is isolated from the floating gate 206 and the select gate 202. The floating gate 206 forms the storage element of the memory cell 102 onto which information can be stored in a non-volatile manner. In other words, a programming current between the drain region 110 and the source region 112 is used for programming the floating gate 206. The controller 108 may be configured to bring the channel 114 of the memory cell 102 into the conductive state by applying respective voltages to the select gate 202 and the control gate 204. If in the conductive state of the channel 114 sufficient energy is stored on the energy storage element 104 and therefore a sufficient programming current is generated between the drain region 110 and the source region 112 the floating gate 206 gets programmed.

The programming principle for the floating gate 206 is also called hot carrier injection. This hot carrier injection works best for the memory cell 102 when biased to its sub-threshold region. Due to technology and device variations each memory cell exhibits a different threshold voltage. Embodiments described herein may additionally solve this issue by a slowly ramped bias of the select gate 202. Hence, each memory cell 102 of a plurality of memory cells of the memory 100 can be biased to the optimum bias for a short period of time, before the onset of the current flow through the memory cell 102 discharges the energy storage element 104 (e.g. the bit line). In other words, the controller 108 may be configured to ramp a signal 208 at the select gate 202 from a first signal level to a second signal level for bringing the channel 114 into the conductive state. According to further embodiments, the controller 108 may be configured to ramp a voltage at the select gate 202 from a first voltage to a second voltage. For example, in the case of an n channel transistor structure the controller 108 may be configured to ramp the voltage at the select gate 202 from a first minimal select gate voltage to a maximum select gate voltage. In the case of a p channel transistor structure the controller 108 may be configured to ramp the voltage at the select gate 202 from a maximum select gate voltage to a minimum select gate voltage. In the case of the present application the term 'ramping' means that different (e.g. at least three) voltages or signal levels are applied to the select gate 202. The ramp applied to the select gate 202 can have discrete steps or can be an analog ramp and can be monotonic.

In other words, the controller 108 may be configured to energize the energy storage element 104 (for example to charge the capacitance of the bit line coupled to the drain region 110) to a certain write bias, which is sufficient for programming the memory cell 102 and to subsequently (after the energy storage element 104 is energized) charge the select gate 202 of the memory cell 102 using a ramp, to reach the optimum bias point for programming the floating gate 206 of the memory cell 102.

Furthermore, the controller 108 may be configured to simultaneously apply a signal 210 (for example a voltage) at the control gate 204 and to ramp the signal 208 at the select gate 202, for bringing the channel 114 into the conductive state.

To summarize, each cell is biased once to its sweet spot during the slow ramping of the select line bias, i.e. has its individual best hot carrier efficiency, the cell is written with the best efficiency. Later, for higher select line bias voltages the cell is already written and the bit line capacitance is discharged, but other cells may reach the sweet spot at this later time during the ramp.

As mentioned before, the memory cell 102 may be configured to store more than two different information states in the memory cell which can be achieved by bringing a different amount of charges to the floating gate 206. As described before, the controller 108 may vary an energizing parameter for energizing the energy storage element 104 in dependence on the information state to be stored on the memory cell 102. According to further embodiments the controller 108 may also be configured to vary a ramp parameter for ramping the signal 208 at the select gate 202 in dependence on the information state to be stored on the memory cell. In other words, the controller 108 may use different ramps for different information states to be stored on the memory cell 102. This enables a programming of all memory cells 102 of the memory 100 being coupled to the same select line receiving the same signal 208.

In other words embodiments a multilevel programming is provided where more than two distinct programming levels are used to store more than one bit of information in one non-volatile memory cell 102. Here, the charging level of the energy storage element 104 (for example of the bit line) during the non-conductive state of the channel 114 can be varied according to the different intended programming levels. Furthermore (additionally or instead of varying the energizing parameter) the controller 108 may vary the ramp parameter for ramping the signal 208 at the select gate 202 for bringing the channel 114 of the memory cell 102 into the conductive state.

In the following different embodiments for implementing the energy storage element 104 will be shown with reference to FIGS. 3a to 3c.

Figure 3A:
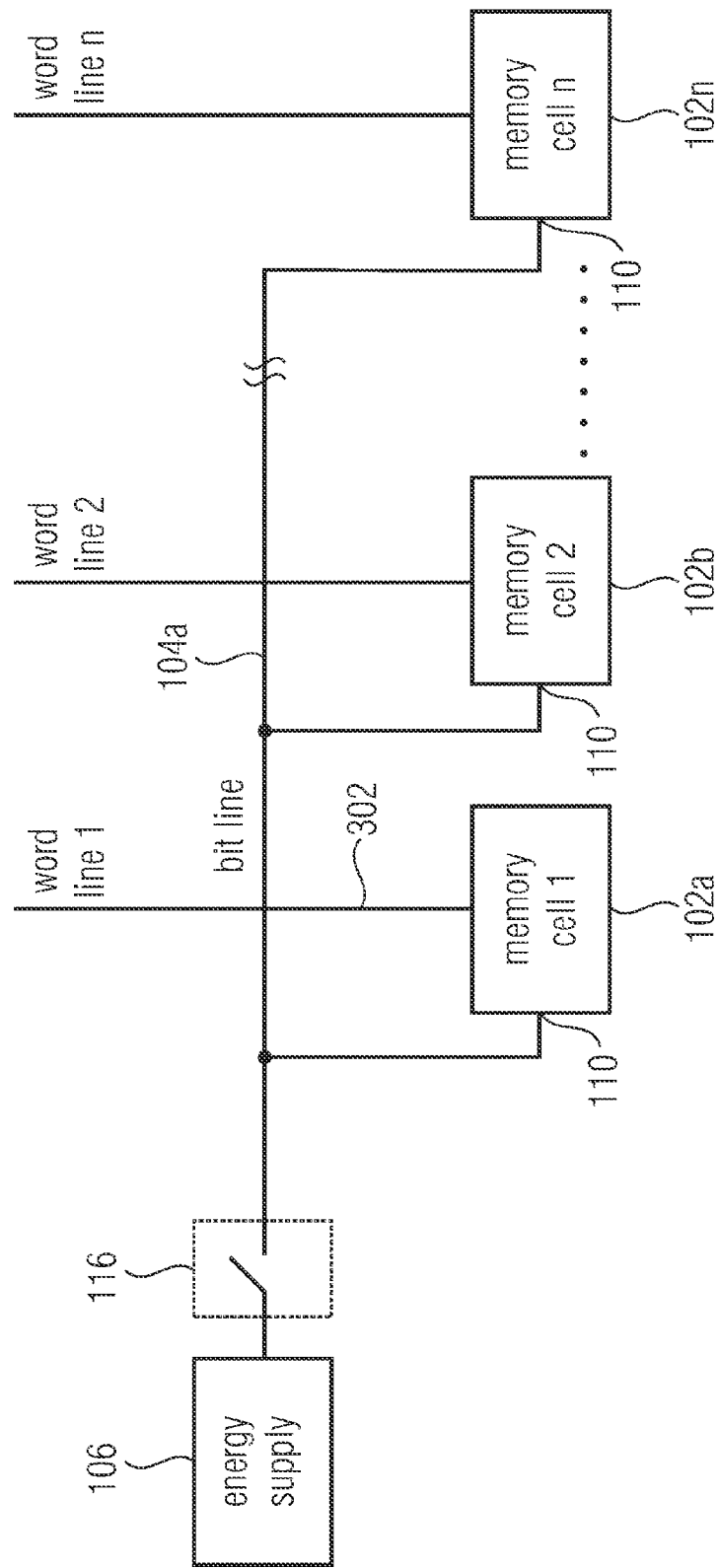
FIG. 3a to FIG. 3c show different possibilities for implementing an energy storage element in accordance with embodiments described herein.

FIG. 3a shows a first possible implementation of the energy storage element 104. In the example shown in FIG. 3a the energy storage element 104 is formed by a bit line 104a. As mentioned before, this bit line 104a may be coupled to first terminals 110 of a plurality of memory cells 102a to 102n and therefore may have a significant length and a significant (parasitic) capacitance. The bit line capacitance of the bit line 104a may be sufficient to store enough energy for programming a memory cell 102a to 102n of the memory (for example of the memory 100). The controller 108 of the memory 100 may bring the channels 114 of the memory cells 102a to 102n into the conductive state by applying sufficient voltages to word lines of the memory 100. In other words, the bit line 104a is charged for all memory cells 102a to 102n coupled to the bit line 104a. After charging the bit line 104a the controller 108 may bring one of the channels 114 of the memory cells 102a to 102n into the conductive state for programming the memory cell of the memory cells 102a to 102n having its channel 114 in the conductive state. For example, the controller 108 may bring the channel 114 of a first memory cell 102a of the memory cells 102a to 102n into the conductive state by applying a voltage at a first word line 302 of the memory, the first word line 302 being coupled to the first memory cell 102a.

As the bit line capacitances of the bit lines of the memory 100 may need to be large enough to store a sufficient amount of charge to supply the programming current a minimum number of word lines is required since the capacitance of the bit line capacitances scales with the number of word lines, i.e. the memory size may not fall below a certain limit. Otherwise the charge stored on the capacitance of the bit line 104a may not be sufficient for programming one of the memory cells 102a to 102n. In this case the shot programming can be supported with additional capacitances.

Figure 3B:
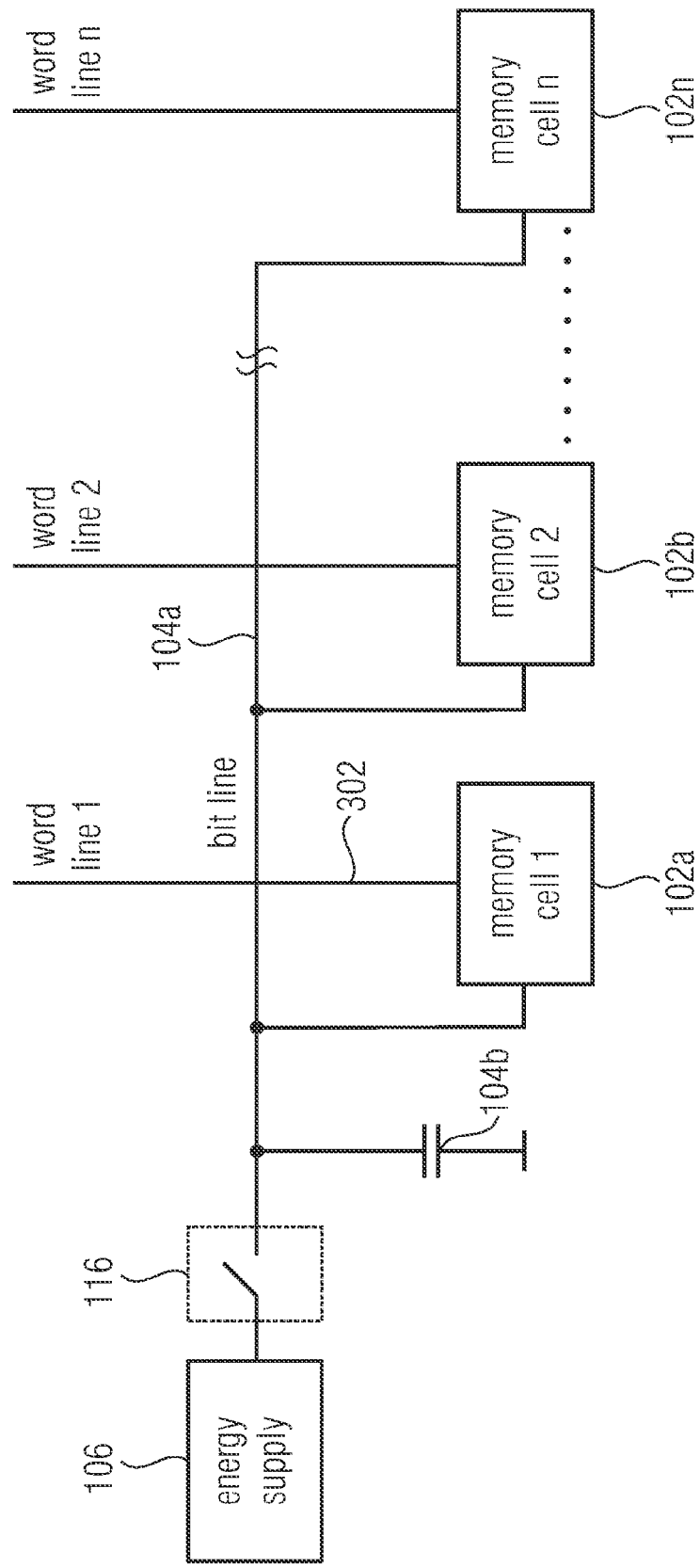

This is shown in an embodiment in FIG. 3b in which an additional (area consuming) capacitance 104b is coupled to the bit line 104a. The bit line 104a and the additional capacitance 104b together form the energy storage element 104, which can also be designated as programming support capacitance. The functionality of the combination of the bit line 104a and the additional capacitance 104b is equal to the example from FIG. 3a, in which only the bit line 104a is used as an energy storage element. In other words, during the non-conductive state of the channels 114 of the memory cells 102a to 102n the capacitance of the bit line 104a and the additional capacitance 104b are charged by the energy supply 106, and subsequently (after the additional capacitance 104b and the capacitance of the bit line 104a are charged) the channel 114 of the first memory cell 102a of the memory cells 102a to 102n is brought into the low impedance state (for example by applying a voltage at the first word line 302) for programming the memory cell 102a based on the charge stored in the additional capacitance 104b and the capacitance of the bit line 104a.

Figure 3C:
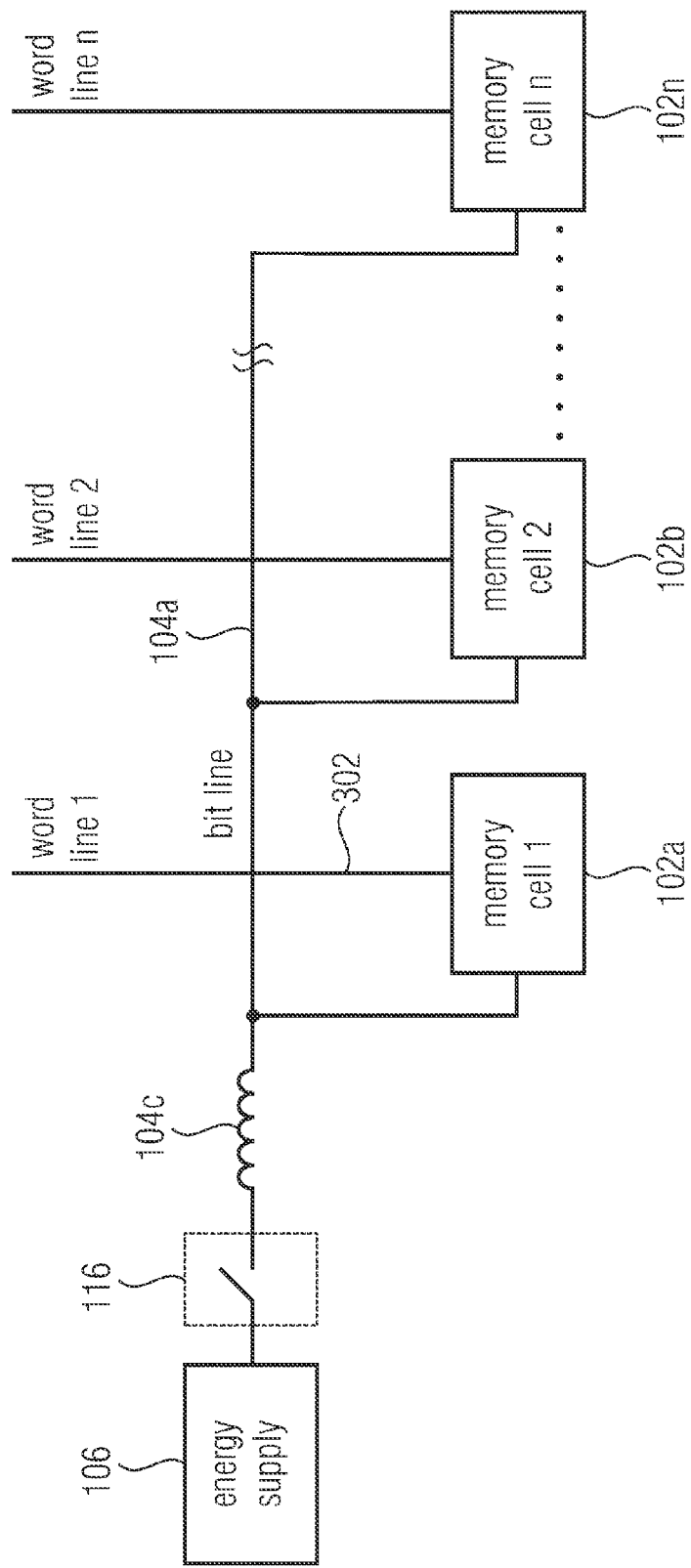

FIG. 3c shows a further embodiment for an implementation of the energy storage element 104. In FIG. 3b the energy storage element 104 is implemented by the capacitance of the bit line 104a and an additional capacitance 104b. In this case in FIG. 3c an inductor 104c is supplied with energy from the energy supply 106 during the non-conductive state of the channels 114 of the memory cells 102a to 102n and the energy stored in the inductor 104c and the charge stored on the capacitance of the bit line 104a can be used for programming one (or more) of the memory cells 102a to 102n during the conductive state of its (their) channel(s) 114.

Figure 4A:
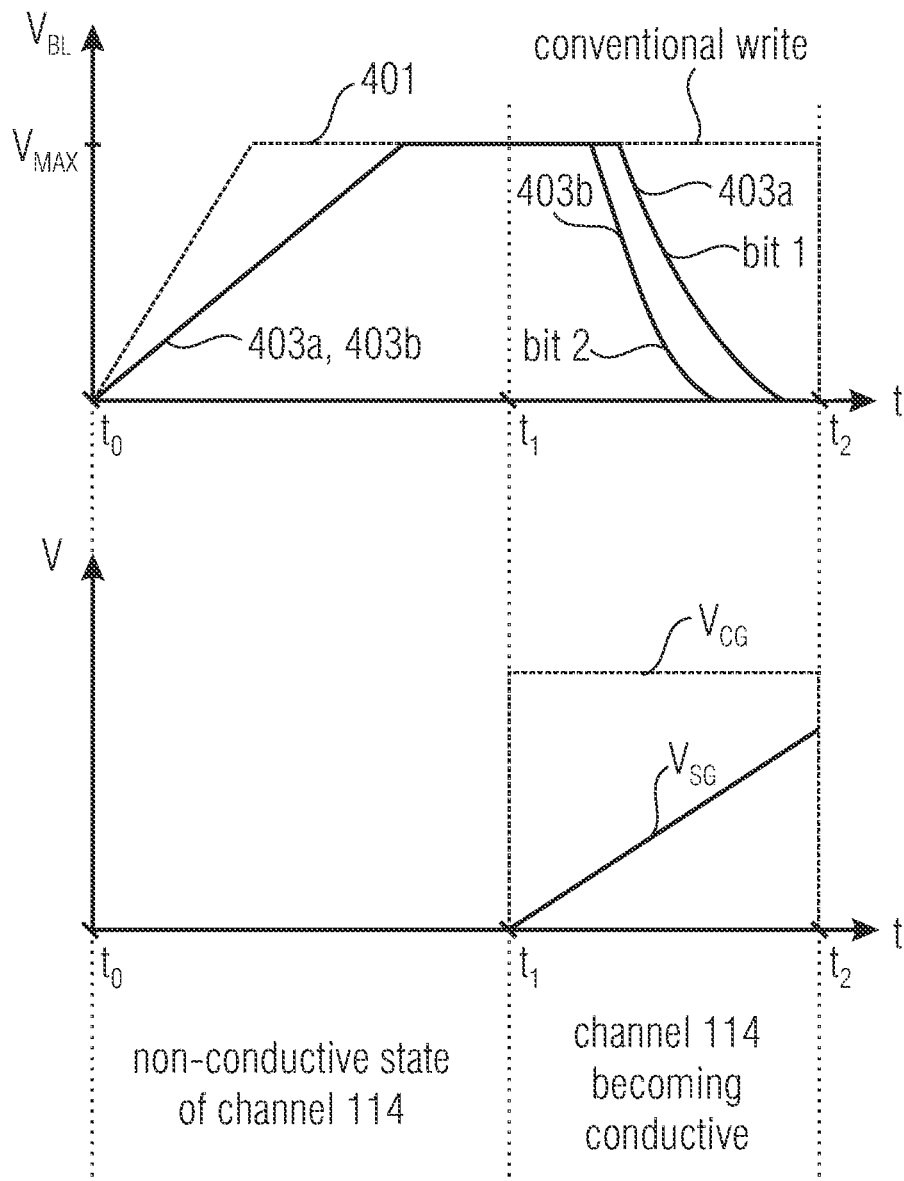
FIG. 4a shows two diagrams for visualizing voltages at memory cells of a memory according to an embodiment during a programming cycle.

FIG. 4a shows in two diagrams how the programming of memory cells of the memory 100 can be performed. The top diagram shows the voltage $V_{BL}$ at bit lines each coupled to a plurality of memory cells (for example the memory cells 102a to 102n) of the memory 100. Curves 403a, 403b show voltages at two different bit lines each coupled to a different plurality of memory cells which occur based on the programming concept described herein. As comparison example a curve 401 represents the voltage at the bit lines for a known programming technique.

In the following the programming concept is described using FIG. 4a. In a first time span (from $t_0$ to $t_1$) the channels 114 of the memory cells 102 of the memory 100 are in the non-conductive state. Therefore, in this first time span the energy storage elements 104 (for example the capacitances of the bit lines) are charged using the energy supply 106. This can be seen with the curves 403a, 403b by the increasing bit line voltage $V_{BL}$. This bit line voltage $V_{BL}$ may be, in this first time span, equal for all bit lines of the memory 100, as typically every bit line has the same length, and therefore (at least approximately) the same bit line capacitance.

The bottom diagram of FIG. 4a shows the voltages at the control gates and the select gates 204 of the memory cells 102 of the memory 100. It can be seen that during the non-conductive state of the channels 114 of the memory cells 102 of the memory 100 no signal is applied to the control gates 204 and the select gates 202 of the memory cells 102, such that the channels 114 of the memory cells 102 are in the non-conductive state.

The diagrams shown in FIG. 4a apply to an n channel transistor structure, of course, in the complimentary case (for example in a p channel transistor structure for the memory cells 102), sufficiently high voltages are applied to the control gates 204 and the select gates 202 of the memory cells 102 of the memory 100 to keep the channels 114 of the memory cells 102 in the non-conductive state.

According to further embodiments, the voltage $V_{CG}$ at the control gates 204 of the memory cells 102 may also be applied during the first time span, as the channels 114 still stay in the non-conductive state as long as no voltage $V_{SG}$ is applied to the select gates 202 of the memory cells 102.

In a second time span ($t_1$ to $t_2$), after charging the bit line capacitances (for example to a maximum voltage $V_{MAX}$ which can be provided by the energy supply 106) the controller 108 brings the channels 114 of a selected number of memory cells 102 (for example being coupled to the same word and select line) of the memory 100 into the conductive state. This can be done by applying an appropriate signal or voltage $V_{CG}$ to the control gates 204 of the memory cells 102 and by ramping the signal 208 or voltage $V_{SG}$ at the select gates 202 of the memory cells 102 from a first signal level to a second signal level. In the embodiment shown in FIG. 4a (for the n channel transistor structure) the voltage $V_{SG}$ at the select gates 202 of the selected memory cells 102 of the memory 100 is increased from a first select gate voltage to a second select gate voltage. Therefore, each memory cell 102 of the memory 100, which is coupled to the chosen select line, is biased to its sweet spot such that each of these memory cells 102 is programmed with its optimal biasing.

In other words, different channels 114 of different memory cells 102 do not become conductive at the same time, but at different times depending on the voltage $V_{SG}$ at their select gates 202. This can be seen by the two different decreases of the curves 403a, 403b for the different bits (or bit lines) of the memory 100 in the top diagram. In this embodiment a sweet spot voltage for a memory cell coupled to a first bit line (bit 1) is higher than a sweet spot voltage of a second memory cell coupled to a second bit line (bit 2), therefore the channel 114 of the memory cell coupled to the second bit line becomes conductive earlier than the channel of the memory cell coupled to the first bit line. Hence, the voltage at the second bit line decreases earlier than the voltage at the first bit line and the memory cell coupled to the second bit line is programmed earlier than the memory cell coupled to the first bit line.

To summarize, the curve 401 in the top diagram shows the bit line voltage along an NVM cell using a conventional programming method. The curves 403a, 403b show a bit line voltage along two individual NVM cells using the programming method described herein (controlled by the controller 108). The programming method described herein has a reduced current consumption, because optimized writing conditions are ensured depending on the individual properties of the NVM cells. Due to the individual bit line voltages falling when the cell has been written, no charge is wasted.

Figure 4B:
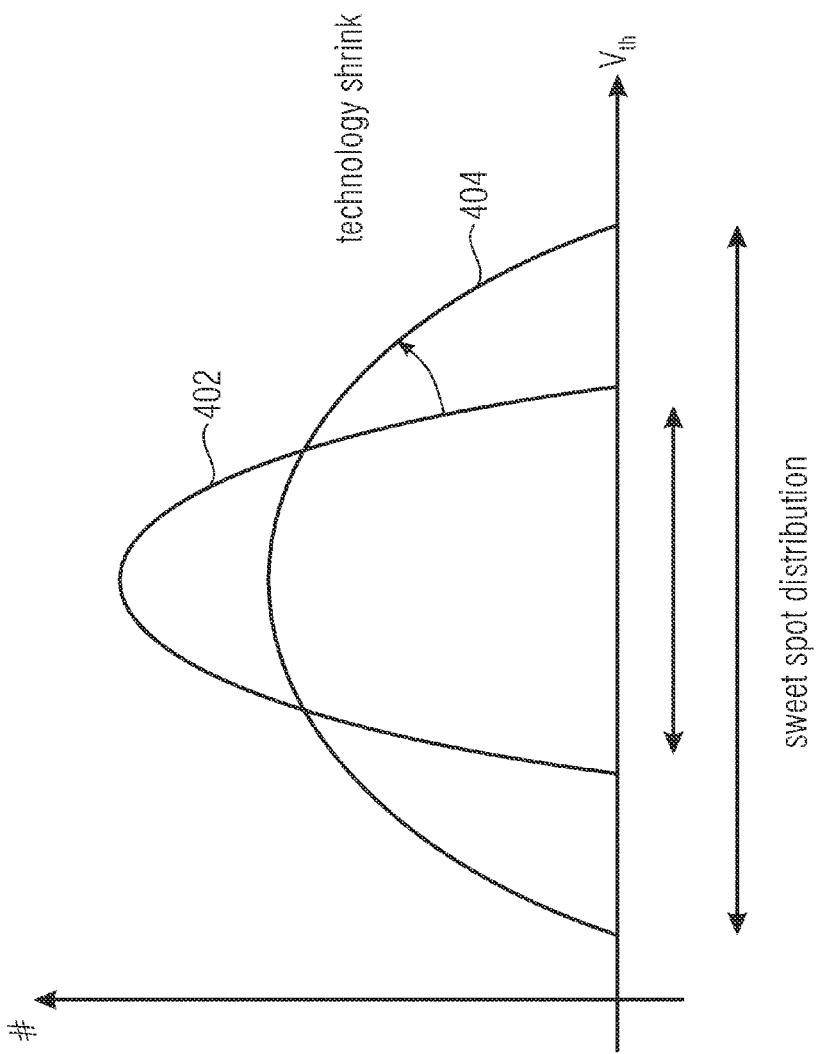
FIG. 4b shows a diagram visualizing the distribution of the threshold voltage of transistors for different transistor sizes.

FIG. 4b shows a sweet spot distribution of transistors for different sizes. In the diagram shown in FIG. 4b on the x-axis the threshold voltage (or the sweet spot voltage) is shown and on the y-axis a number of transistors is shown. A first curve 402 corresponds to a comparatively large transistor size (in area) and a second curve 404 corresponds to a comparatively small transistor size (in area). It can be seen that for decreasing transistor size the sweet spot distribution gets larger. Hence, by ramping the select gate voltage it still can be achieved that even for small transistor sizes each transistor structure of each memory cell is biased to its sweet spot and therefore programmed under optimal conditions.

In other words, the standard deviation σ of the sweet spot distribution is anti-proportional to the size of the transistors according to:

$$\sigma \sim \frac{1}{\sqrt{WL}},$$

where W is the channel width of a transistor and L is the channel length of the transistor.

To summarize, with technology shrinking the difference between the individual NVM cells becomes larger (the distribution a of the individual $V_{th}$ becomes broader) due to the dependence on the standard deviation of $V_{th}$ (σ) from the cell dimensions (W and L) as given by formula 1. So the programming method described herein becomes more important, because of the automatic optimization by ramping the signal 208 at the select gate 202, as described above.

Figure 5:
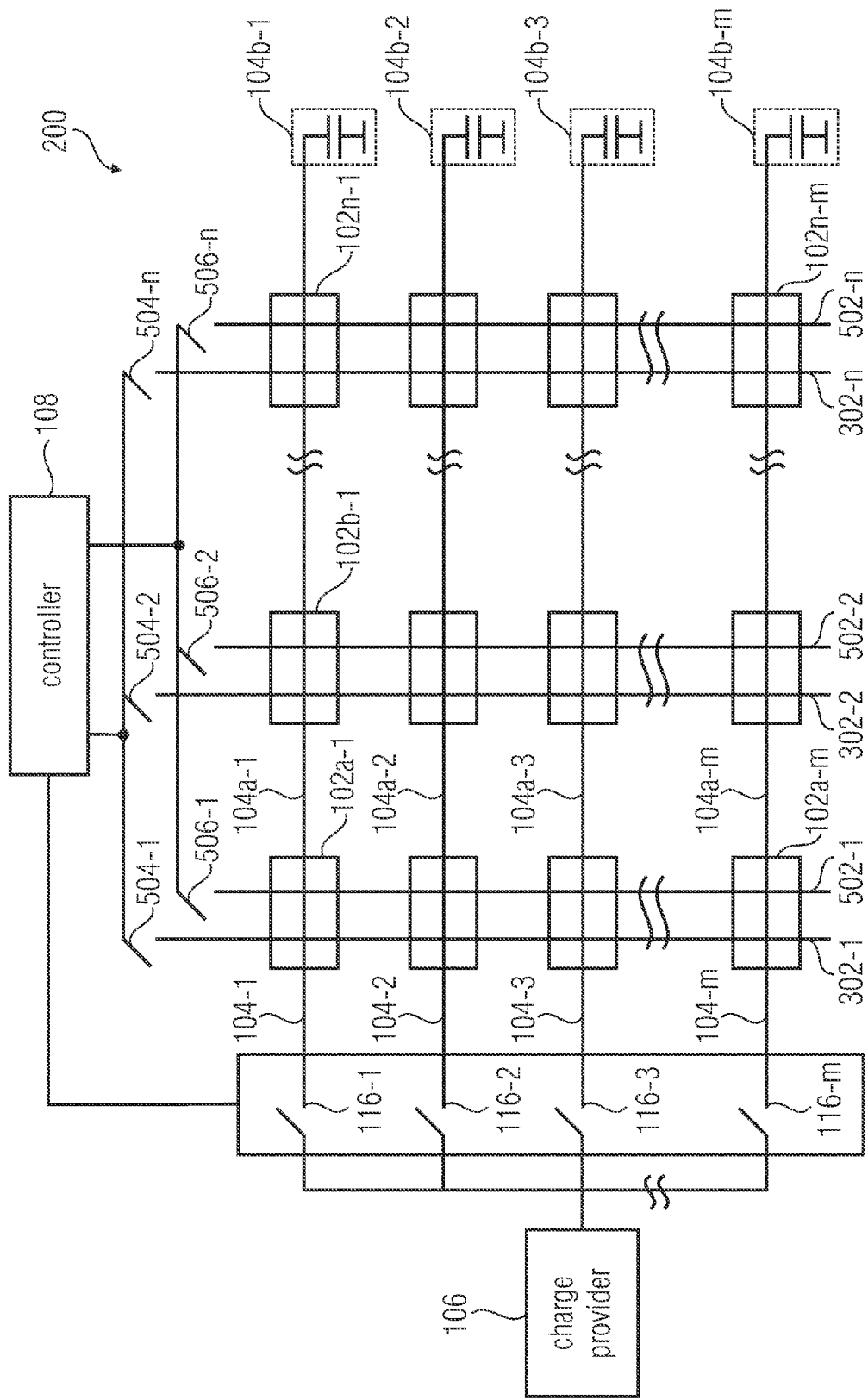
FIG. 5 shows a block schematic diagram of a memory according to a further embodiment.

FIG. 5 shows a block schematic diagram of a memory 200 according to an embodiment. The memory 200 includes a plurality of memory cells 102a-1 to 102n-m, each memory cell 102a-1 to 102n-m including a first terminal, a second terminal and a channel extending between the first terminal and the second terminal. Therefore, the memory cells 102a-1 to 102n-m may be equal to the memory cell 102 described above in conjunction with FIGS. 1 and 2. Furthermore, the memory 200 includes a plurality of programming support capacitances 104-1 to 104-m (formed by bitlines 104a-1 to 104a-m and optional additional capacitances 104b-1 to 104b-m). Each of the programming support capacitances 104-1 to 104-m is coupled to a first terminal of a memory cell 102a-1 to 102n-m of the plurality of memory cells 102a-1 to 102n-m. Furthermore, the memory 200 includes a charge provider 106 coupled to the plurality of programming support capacitances 104-1 to 104-m.

Furthermore, the memory 200 includes a controller 108 configured to activate the charge provider 106 and to bring the channels of the plurality of memory cells 102a-1 to 102n-m into a non-conductive state for charging the programming support capacitances being coupled to the charge provider 106, and to subsequently bring the channels of the plurality of memory cells 102a-m to 102n-m into a conductive state for programming the plurality of memory cells 102a-1 to 102n-m based on the charges stored in the plurality of programming support capacitances.

In the embodiment shown in FIG. 5 the memory 200 includes the plurality of bit lines 104a-1 to 104a-m, each bit line 104a-1 to 104a-m being coupled to a plurality of memory cells. For example a first bit line 104a-1 is coupled to a first plurality of memory cells 102a-1 to 102n-1 of the plurality of memory cells 102a-1 to 102n-m. Therefore, the memory cells 102a-1 to 102n-1 share a first programming support capacitance 104-1. As in the embodiment shown in FIG. 5, the programming support capacitances are (at least partially) formed by capacitances of the bit lines 104a-1 to 104a-m. Optionally, the programming support capacitances 104-1 to 104-m may include the additional capacitances 104b-1 to 104b-m. Furthermore, the programming support capacitances 104-1 to 104-*m* may be coupled to the charge provider 106 by a plurality of switches 116-1 to 116-*m*.

As an example, the controller 108 may be configured to decouple the first programming support 104-1 capacitance being coupled to the memory cells 102*a*-1 to 102*n*-1, which may not be programmed during the current programming cycle, from the charge provider 106, such that the first programming support capacitance 104-1 is not charged during the non-conductive state of the channels 114 of the memory cells 102*a*-1 to 102*n*-1. In other words, the controller 108 may choose a number of memory cells to be programmed by closing or opening the corresponding switches 116-1 to 116-*m*, such that during the non-conductive states of the channels 114 of the memory cells 102*a*-1 to 102*n*-*m* only these programming support capacitances are charged that are coupled to the charge provider 106, and therefore only those memory cells 102*a*-1 to 102*n*-*m* are programmed which have their bit line coupled to the charge provider 106.

According to a further embodiment the controller 108 may be configured to discharge the first programming support capacitance 104-1 before the channels 114 of the memory cells 102*a*-1 to 102*n*-1 are brought into the conductive state, such that in the conductive state of the channels of the memory cells 102*a*-1 to 102*n*-1 none of the memory cells 102*a*-1 to 102*n*-1 get programmed.

In other words, memory cells on bit lines that are either not charged during the non-conductive state of the channels 114 of the memory cells 102*a*-1 to 102*n*-*m* or that are discharged again before the channels 114 of the memory cells 102*a*-1 to 102*n*-*m* are brought into the conductive state are not programmed and stay in their respective old state.

Furthermore, the memory 200 includes a plurality of word lines 302-1 to 302-*n* being coupled to the plurality of memory cells 102*a*-1 to 102*n*-*m*. Each word line 302-1 to 302-*n* is coupled to a group of memory cells, wherein each memory cell out of one group is coupled to a different bit line. As an example, a first word line 302-1 may be coupled to a first group of memory cells 102*a*-1 to 102*a*-*m* and each memory cell 102*a*-1 to 102*a*-*m* may be coupled to a different bit line 104*a*-1 to 104*a*-*m*. By this crossing scheme as shown in FIG. 5 the controller 108 can address every memory cell 102*a*-1 to 102*n*-*m* using the switches 116-1 to 116-*m* and switches 504-1 to 504-*n* for coupling the word lines 302-1 to 302-*n* to the controller 108. The controller 108 is configured to apply a voltage to the word lines 302-1 to 302-*n* for bringing the channels 114 of the plurality of memory cells 102*a*-1 to 102*n*-*m* into the conductive state. As an example, the controller 108 may choose a word line (for example a first word line 302-1) out of the plurality of word lines 302-1 to 302-*n* to be programmed. The memory cells along one word line (for example the memory cells 102*a*-1 to 102*a*-*m*) may be called a page of the memory 200. By charging the programming support capacitances 104-1 to 104-*n* (i.e. the capacitances of the bit lines 104*a*-1 to 104*a*-*m* and optionally the additional capacitances 104*b*-1 to 104*b*-*m*) during the non-conductive states of the channels 114 of the memory cells 102*a*-1 to 102*n*-*m* and by subsequently (after the programming support capacitances 104-1 to 104-*m* are charged) bringing the channels 114 of the memory cells 102*a*-1 to 102*n*-*m* into the conductive state it can be achieved that a complete page of the memory (for example, if a first switch 504-1 is in a low impedance state and the other switches 504-2 to 504-*n* are in a high impedance state) gets programmed. In the conventional concept this programming is only possible with a low number of memory cells per page, since the driving capability of the charge pump is typically limited.

To summarize, embodiments of the present invention enable a faster programming of memory cells, which use hot carrier injection as a programming mechanism. This is achieved by a rather slow charging of bit line capacitances of the selected memory cells (which are for example NVM cells) using the existing rather small charge provider 106 (which may be implemented as a charge pump) and by a programming of all of the cells in parallel where the necessary programming current is (mainly) supplied from the charged bit line capacitances (so-called shot programming) and only partially (if at all) from the charge provider 106 (or the charge pump 106).

Furthermore, the memory 200 enables a variable number of bits to be programmed in parallel (using the switches 116-1 to 116-*m*), a programming of full page in one shot (by making use of the energized energy storage elements or the charged programming support capacitances). Furthermore, embodiments enable the programming of parts of a page per shot (when using the switches 116-1 to 116-*m*). Furthermore, as already described with the memory 100, the controller 108 may be configured to deactivate and/or decouple the charge provider 106 from the memory cells 102*a*-1 to 102*n*-*m* during the programming of the memory cells 102*a*-1 to 102*n*-*m*, such that the programming currents for programming the memory cells 102*a*-1 to 102*n*-*m* is supplied only from the programming support capacitances 104-1 to 104-*m*. According to further embodiments, the controller 108 may leave the charge provider 106 active and coupled to the memory cells 102*a*-1 to 102*n*-*m* during the programming, such that during the programming the necessary programming currents are supplied from the programming support capacitances 104-1 to 104-*m* as well as from the charge provider 106.

Furthermore, the additional capacitances 104*b*-1 to 104*b*-*m* may be implemented for the case where the bit line capacitances themselves are not large enough, for example for a small number of word lines 302-1 to 302-*n*.

The memory cells 102*a*-1 to 102*n*-*m* may be for example ETOX cells or HS3P cells (hot source triple poly).

In the case of using triple poly cells, e.g. as shown in FIG. 2, (with an additional select gate 202) the memory 200 may include a plurality of select lines 502-1 to 502-*n* which may be parallel to the word lines 302-1 to 302-*n*. As an example, a first select line 502-1 may be coupled to the same memory cells 102*a*-1 to 102*a*-*m* as the first word line 302-1. While the word lines 302-1 to 302-*n* may be coupled to the control gates 204 of the memory cells 102*a*-1 to 102*n*-*m*, the select lines 502-1 to 502-*n* may be coupled to the select gates 202 of the memory cells 102*a*-1 to 102*n*-*m*. Furthermore, the select lines 502-1 to 502-*n* may be coupled by switches 506-1 to 506-*n* to the controller 108. The controller 108 may be configured to ramp a voltage at the select lines 502-1 to 502-*n* from a first select line voltage to a second select line voltage for successively bringing the channels 114 of the memory cells 102*a*-1 to 102*n*-*m* into the conductive state.

As an example, for programming the first page of the memory 200 the controller 108 may put a chosen number of switches 116-1 to 116-*m* into a low conductive state, while the switches 501-1 to 504-*n* and the switches 506-1 to 506-*n* are in a high impedance state, such that the channels 114 of the memory cells 102*a*-1 to 102*n*-*m* are in a non-conductive state. During this non-conductive state the bit line capacitances of the bit lines 104*a*-1 to 104*a*-*m* (and optionally the additional capacitances 104*b*-1 to 104*b*-*m*) coupled to the charge provider 106 can be charged by the charge provider 106, for example, until a certain threshold voltage is reached or exceeded, which is sufficient for programming the chosen memory cells.

Subsequently the controller 108 may close the switch 504-1 and apply a voltage to the first word line 302-1, such that a sufficiently high voltage is supplied at the control gates 204 of the memory cells 102a-1 to 102a-m of the first page. Furthermore, the controller 108 may close the switch 506-1 and ramp a voltage at the first select line 502-1, such that each memory cells 102-1 to 102-m of the first page is biased to its sweet spot and gets programmed at its sweet spot. During the programming of the memory cells 104a-1 to 104a-m of the first page the charge provider 106 may be deactivated and decoupled from the memory cells 104a-1 to 104a-m or may stay activated and coupled.

The described shot programming results in an overall fast operation and in a constant programming time independent of the data to be programmed. Additionally, the current consumption during the programming can easily be made independent of the data too. Constant timing and constant current are advantageous for security critical applications, since no information about the program data is leaked to the outside through timing or current.

Embodiments enable a fast programming of all NVM cell types that require a current for programming, especially all hot carrier programmed NVMs, like for example HS3P or ETOX.

Figure 6:
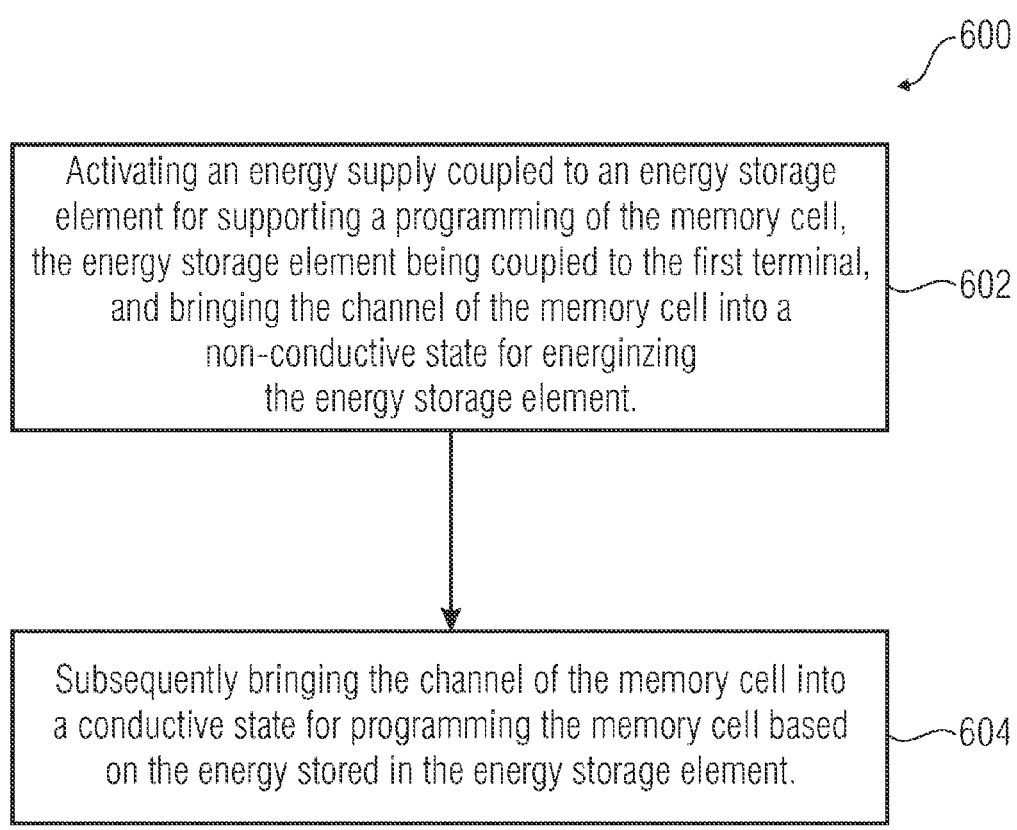
FIG. 6 shows a flow diagram of a method for programming a memory cell according to an embodiment.

FIG. 6 shows an embodiment of a flow diagram of a method 600 for programming a memory cell, the memory cell including a first terminal, a second terminal and a channel extending between the first terminal and the second terminal. The method 600 includes a step 602 of activating an energy supply coupled to an energy storage element for supporting a programming of the memory cell, the energy storage element being coupled to the first terminal, and of bringing the channel of the memory cell in a non-conductive state for energizing the energy storage element.

Furthermore, the method 600 includes a step 604 of subsequently (after the energy storage element has been energized) bringing the channel of the memory cell into a conductive state for programming the memory cell based on the energy stored in the energy storage element. The method 600 may be performed, for example, with the memory 100.

Figure 7:
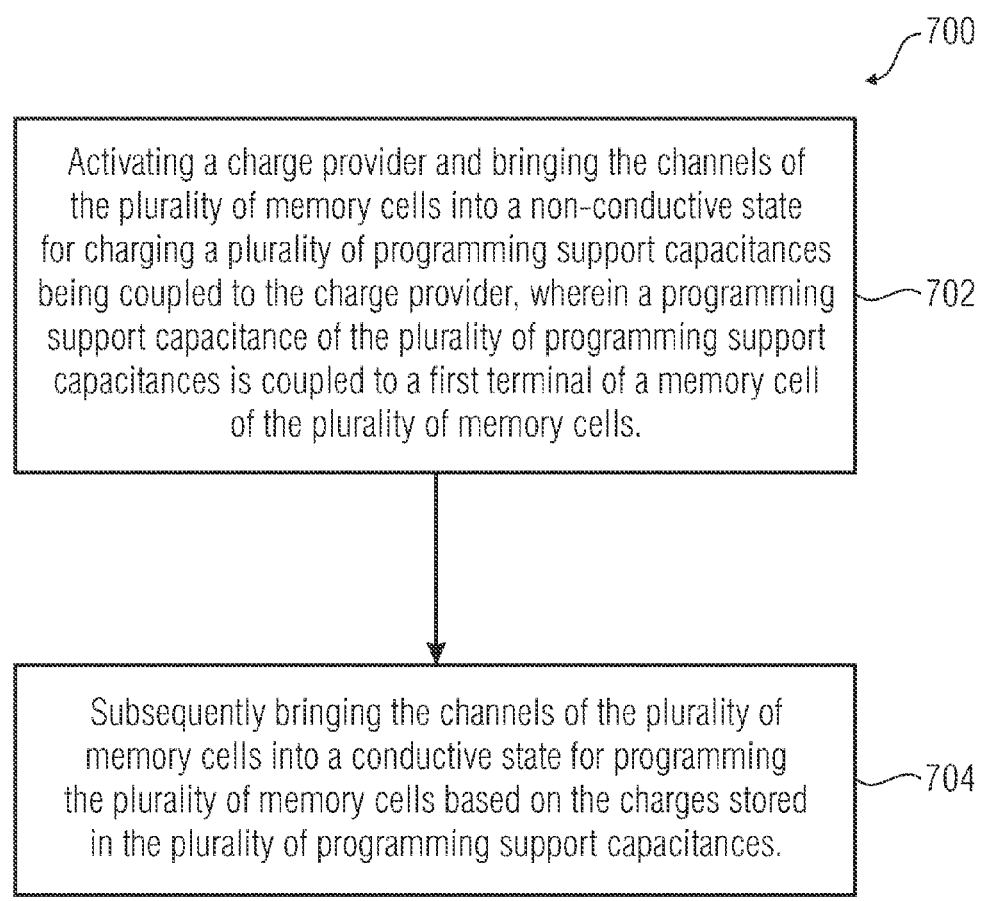
FIG. 7 shows a flow diagram of a method for programming a plurality of memory cells according to an embodiment.

FIG. 7 shows an embodiment of a flow diagram of a method 700 for programming a plurality of memory cells including a first terminal, a second terminal and a channel extending between the first terminal and the second terminal.

The method 700 includes a step 702 of activating a charge provider and bringing the channels of the plurality of memory cells into a non-conductive state for charging a plurality of programming support capacitances being coupled to the charge provider, wherein a programming support capacitance of the plurality of programming support capacitances is coupled to a first terminal of a memory cell of the plurality of memory cells.

Furthermore, the memory 700 includes a step 704 of subsequently (after the programming support capacitances coupled to the charge provider are charged) bringing the channels of the plurality of memory cells into a conductive state for programming the plurality of memory cells based on the charges stored in the plurality of programming support capacitances.

To summarize, embodiments described herein enable a faster programming of NVM cells, especially HS3P cells, which use hot carrier injection as a programming mechanism.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a memory cell comprising a first terminal, a second terminal and a channel extending between the first terminal and the second terminal;
   an energy storage element configured to support a programming of the memory cell, the energy storage element being coupled to the first terminal;
   an energy supply coupled to the energy storage element; and
   a controller configured to activate the energy supply and to bring the channel of the memory cell into a non-conductive state for energizing the energy storage element, and to subsequently bring the channel of the memory cell into a conductive state for programming the memory cell based on the energy stored in the energy storage element;
   wherein the memory cell comprises a select gate; and
   wherein the controller is configured to ramp a signal at the select gate from a first signal level to a second signal level for bringing the channel into the conductive state.

2. The memory according to claim 1,
   wherein the energy storage element is a programming support capacitance coupled to the first terminal;
   wherein the energy supply is a charge provider coupled to the programming support capacitance; and
   wherein the controller is configured to activate the charge provider and to bring the channel of the memory cell in the non-conductive state for charging the programming support capacitance, and to subsequently bring the channel of the memory cell into the conductive state for programming the memory cell based on the charge stored in the programming support capacitance.

3. The memory according to claim 1, further comprising a bit line coupled to the first terminal, wherein the energy storage element is at least partially formed by a capacitance of the bit line.

4. The memory according to claim 1, further comprising:
   a bit line coupled to the first terminal of the memory cell; and
   an additional capacitance coupled to the first terminal;
   wherein the energy storage element is formed by a capacitance of the bit line and the additional capacitance.

5. The memory according to claim 1, wherein the controller is configured to bring the channel of the memory cell into the conductive state after an energy at the energy storage element has reached at least 80% of an energy storage capacity of the energy storage element.

6. The memory according to claim 1,
   wherein the memory cell comprises a control terminal; and
   wherein the controller is configured to simultaneously apply a voltage at the control terminal and to ramp the signal at the select gate from the first signal level to the second signal level, for bringing the channel into the conductive state.

7. The memory according to claim 1, wherein the controller is configured to deactivate the energy supply after energizing the energy storage element, such that during the programming of the memory cell the energy supply is deactivated.

8. The memory according to claim 1,
   wherein the energy supply is coupled to the energy storage element by a switch; and
   wherein the controller is configured to decouple the energy supply from the energy storage element after energizing the energy storage element, such that during the programming of the memory cell the energy supply is decoupled from the energy storage element.

9. The memory according to claim 1, wherein the controller is configured to keep the energy supply active and coupled to the energy storage element during the programming of the memory cell.

10. The memory according to claim 1,
    wherein the memory is configured to store more than two different information states in the memory cell; and
    wherein the controller is configured to vary an energizing parameter for energizing the energy storage element with the energy supply during the non-conductive state of the channel in dependence on an information state to be stored on the memory cell.

11. The memory according to claim 10, wherein the controller is configured to vary an energizing time for energizing the energy storage element in dependence on the information state to be stored on the memory cell.

12. The memory according to claim 1,
    wherein the memory is configured to store more than two different information states in the memory cell; and
    wherein the controller is configured to vary a ramp parameter for ramping the signal at the select gate in dependence on the information state to be stored on the memory cell.

13. The memory according to claim 1, wherein the memory is a non-volatile memory.

14. The memory according to claim 1, further comprising:
    a transistor structure having a source region, a drain region and a channel region;
    wherein the first terminal of the memory cell is formed by the drain region, the second terminal of the memory cell is formed by the source region and the channel of the memory cell is formed by the channel region.

15. The memory according to claim 1, wherein the memory cell is a triple poly cell or an ETOX cell.

16. A memory comprising:
    a plurality of memory cells comprising a first terminal, a second terminal and a channel extending between the first terminal and the second terminal;
    a plurality of programming support capacitances, a programming support capacitance of the plurality of programming support capacitances being coupled to a first terminal of a memory cell of the plurality of memory cells;

a charge provider coupled to the plurality of programming support capacitances; and a controller configured to activate the charge provider and to bring the channels of the plurality of memory cells into a non-conductive state for charging the programming support capacitances being coupled to the charge provider, and to subsequently bring the channels of the plurality of memory cells into a conductive state for programming the plurality of memory cells based on the charges stored in the plurality of programming support capacitances;

wherein each of the memory cells comprises a select gate;

wherein the memory further comprises a select line coupled to the select gates of the plurality of memory cells; and wherein the controller is configured to ramp a voltage at the select line from a first select line voltage to a second select line voltage for bringing the channels of the memory cells into the conductive state.

17. The memory according to claim 16, wherein the charge provider is coupled to the plurality of programming support capacitances by a plurality of switches; and wherein the controller is configured to decouple a first programming support capacitance being coupled to a first terminal of a first memory cell, which is not to be programmed, from the charge provider, such that the first programming support capacitance is not charged during the non-conductive state of the channel of the first memory cell.

18. The memory according to claim 16, wherein the controller is configured to discharge a first programming support capacitance being coupled to a first terminal of a first memory cell, which is not to be programmed, before bringing a channel of the first memory cell into the conductive state.

19. The memory according to claim 16, further comprising a word line coupled to the plurality of memory cells; and wherein the controller is configured to apply a voltage to the word line for bringing the channels of the plurality of memory cells into the conductive state.

20. A memory comprising:

a memory cell comprising a first terminal, a second terminal, a channel extending between the first terminal and the second terminal, a control gate, a floating gate arranged between the channel and the control gate and a select gate arranged adjacent the channel;

a programming support capacitance coupled to the first terminal and being at least partially formed by a bit line capacitance of a bit line of the memory coupled to the first terminal;

a charge pump coupled to the programming support capacitance; and a controller configured to activate the charge pump and to bring the channel of the memory cell into a non-conductive state for charging the programming support capacitance, and, after a voltage at the programming support capacitance has reached at least 80% of its maximum voltage, to subsequently bring the channel of the memory cell into a conductive state, by means of a voltage at the control gate of the memory cell and by ramping a voltage at the select gate of the memory cell from a first select gate voltage to a second select gate voltage, for programming the memory cell by charging the floating gate of the memory cell using carrier injection based on the charge stored in the programming support capacitance.

21. A memory comprising:

a plurality of word lines;

a plurality of select lines;

a plurality of bit lines;

a plurality of programming support capacitances, each programming support capacitance being at least partially formed by a bit line capacitance of a bit line of the plurality of bit lines;

a plurality of memory cells, each memory cell comprising a first terminal, a second terminal, a channel extending between the first terminal and the second terminal, a control gate, a floating gate arranged between the channel and the control gate, and a select gate arranged adjacent the channel;

wherein a control gate of a memory cell of the plurality of memory cells is coupled to a word line of the plurality of word lines, a select gate of the memory cell is coupled to a select line of the plurality of select lines, and a first terminal of the memory cell is coupled to a bit line of the plurality of bit lines;

a charge pump coupled to the programming support capacitances by a plurality of switches; and a controller configured to activate the charge pump, and to bring the channels of the plurality of memory cells into a non-conductive state for charging the programming support capacitances being coupled to the charge pump, and, after voltages at the programming support capacitances being coupled to the charge pump have reached at least 80% of their maximum voltage, to subsequently bring channels of memory cells which are coupled to a first word line and a first select line into a conductive state by means of a voltage at the first word line and by ramping a voltage at the first select line from a first select line voltage to a second select line voltage for programming the memory cells coupled to the first word line and the first select line by charging the floating gates of the memory cells coupled to the first word line and the first select line using carrier injection based on the charges stored in the programming support capacitances.

22. A method of programming a memory cell comprising a first terminal, a second terminal, a channel extending between the first terminal and the second terminal, and a select gate, the method comprising:

activating an energy supply coupled to an energy storage element configured to support a programming of the memory cell, the energy storage element being coupled to the first terminal, and bringing the channel of the memory cell into a non-conductive state for energizing the energy storage element; and subsequently bringing the channel of the memory cell into a conductive state by ramping a signal at the select gate from a first signal level to a second signal level for programming the memory cell based on the energy stored in the energy storage element.

23. A method of programming a memory cell comprising a first terminal, a second terminal, a channel extending between the first terminal and the second terminal, and a select gate, the method comprising:

activating a charge provider and bringing the channels of the plurality of memory cells into a non-conductive state for charging a plurality of programming support capacitances being coupled to the charge provider, wherein a programming support capacitance of the plurality of programming support capacitances is coupled to a first terminal of a memory cell of the plurality of memory cells; and subsequently bringing the channels of the plurality of memory cells into a conductive state by ramping a voltage at a select line coupled to the select gates of the plurality of memory cells from a first select line voltage to a second select line voltage for programming the plurality of memory cells based on the charges stored in the plurality of programming support capacitances.

24. A non-transitory computer program stored in readable medium having instructions stored thereon for performing a method according to claim 22.

25. A non-transitory computer program stored in readable medium having instructions stored thereon for performing a method according to claim 23.

26. A memory comprising:
a memory cell comprising a first terminal, a second terminal and a channel extending between the first terminal and the second terminal;
an energy storage element configured to support a programming of the memory cell, the energy storage element being coupled to the first terminal;
an energy supply coupled to the energy storage element; and
a controller configured to activate the energy supply and to bring the channel of the memory cell into a non-conductive state for energizing the energy storage element, and to subsequently bring the channel of the memory cell into a conductive state for programming the memory cell based on the energy stored in the energy storage element;
wherein the memory is configured to store more than two different information states in the memory cell; and
wherein the controller is configured to vary an energizing parameter for energizing the energy storage element with the energy supply during the non-conductive state of the channel in dependence on an information state to be stored on the memory cell.

27. A memory comprising:
a memory cell comprising a first terminal, a second terminal and a channel extending between the first terminal and the second terminal;
an energy storage element configured to support a programming of the memory cell, the energy storage element being coupled to the first terminal;
an energy supply coupled to the energy storage element; and
a controller configured to activate the energy supply and to bring the channel of the memory cell into a non-conductive state for energizing the energy storage element, and to subsequently bring the channel of the memory cell into a conductive state for programming the memory cell based on the energy stored in the energy storage element;
wherein the memory cell comprises a select element;
wherein the controller is configured to ramp a signal at the select element from a first signal level to a second signal level for bringing the channel into the conductive state;
wherein the memory is configured to store more than two different information states in the memory cell; and
wherein the controller is configured to vary a ramp parameter for ramping the signal at the select element in dependence on the information state to be stored on the memory cell.

* * * * *